United States Patent
Gruendler et al.

(10) Patent No.: US 7,688,592 B2
(45) Date of Patent: Mar. 30, 2010

(54) COOLING SYSTEM FOR DEVICES HAVING POWER SEMICONDUCTORS AND METHOD FOR COOLING THE DEVICE

(75) Inventors: Gerold Gruendler, Regensburg (DE); Juergen Hoegerl, Regensburg (DE); Volker Strutz, Tegernheim (DE); Erick Syri, Wenzenbach (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 10/598,285

(22) PCT Filed: Feb. 22, 2005

(86) PCT No.: PCT/DE2005/000299

§ 371 (c)(1),
(2), (4) Date: Jun. 21, 2007

(87) PCT Pub. No.: WO2005/081309

PCT Pub. Date: Sep. 1, 2005

(65) Prior Publication Data
US 2007/0285895 A1    Dec. 13, 2007

(30) Foreign Application Priority Data
Feb. 23, 2004  (DE)  ........................ 10 2004 009 055

(51) Int. Cl.
  *H05K 7/20* (2006.01)
  *F28F 7/00* (2006.01)
  *H01L 23/34* (2006.01)

(52) U.S. Cl. ........................ 361/719; 361/697; 361/711; 361/702; 361/703; 257/720; 165/80.2; 165/80.3; 165/185

(58) Field of Classification Search ................. 361/697, 361/704, 715–716, 719; 165/80.3, 185; 439/485, 439/487
See application file for complete search history.

(56) References Cited

U.S. PATENT DOCUMENTS

| | | | |
|---|---|---|---|
| 4,825,337 A | | 4/1989 | Karpman |
| 5,109,318 A | * | 4/1992 | Funari et al. ................. 361/710 |
| 5,161,087 A | | 11/1992 | Frankeny et al. |
| 5,680,295 A | * | 10/1997 | Le et al. ...................... 361/695 |
| 5,966,287 A | | 10/1999 | Lofland et al. |
| 6,031,727 A | * | 2/2000 | Duesman et al. ............ 361/761 |
| 6,119,765 A | | 9/2000 | Lee |

(Continued)

FOREIGN PATENT DOCUMENTS

EP    0926939    3/2003

*Primary Examiner*—Jayprakash N Gandhi
*Assistant Examiner*—Bradley H Thomas
(74) *Attorney, Agent, or Firm*—Dicke, Billig & Czaja, PLLC

(57) ABSTRACT

A cooling system for devices having power semiconductors and a method for cooling the device is disclosed. In one embodiment, the cooling system has printed circuit boards arranged on a circuit carrier in plug-in contact strips. The cooling system itself has a cooling plate, which is mounted in a pivotable manner on one of the plug-in contact strips in the region of the power semiconductor component. The cooling plate can be pivoted about an axis in such a way that it assumes a first position, which is pivoted away from the printed circuit board, and a second position, in which the cooling plate bears on the power semiconductor component.

25 Claims, 3 Drawing Sheets

U.S. PATENT DOCUMENTS

| | | | |
|---|---|---|---|
| 6,130,820 A * | 10/2000 | Konstad et al. | 361/695 |
| 6,188,576 B1 | 2/2001 | Ali et al. | |
| 6,233,150 B1 | 5/2001 | Lin et al. | |
| 6,266,244 B1 | 7/2001 | Guthrie | |
| 6,278,610 B1 * | 8/2001 | Yasufuku et al. | 361/704 |
| 6,297,966 B1 * | 10/2001 | Lee et al. | 361/799 |
| 6,362,966 B1 * | 3/2002 | Ali et al. | 361/728 |
| 6,424,532 B2 | 7/2002 | Kawamura | |
| 6,466,441 B1 | 10/2002 | Suzuki | |
| 6,535,387 B2 | 3/2003 | Summers et al. | |
| 6,707,673 B2 * | 3/2004 | Duesman et al. | 361/704 |
| 6,775,139 B2 * | 8/2004 | Hsueh | 361/697 |
| 6,888,719 B1 | 5/2005 | Janzen et al. | 361/687 |
| 6,890,202 B2 * | 5/2005 | Yasufuku et al. | 439/331 |
| 7,079,396 B2 * | 7/2006 | Gates et al. | 361/719 |
| 7,187,552 B1 * | 3/2007 | Stewart et al. | 361/704 |
| 7,312,996 B2 * | 12/2007 | Chang | 361/704 |
| 7,349,219 B2 * | 3/2008 | Lai et al. | 361/719 |
| 7,349,220 B2 * | 3/2008 | Lai et al. | 361/719 |
| 7,365,985 B1 * | 4/2008 | Ni | 361/715 |
| 7,400,506 B2 * | 7/2008 | Hoss et al. | 361/715 |
| 7,403,383 B2 * | 7/2008 | McGuff et al. | 361/688 |
| 2001/0000684 A1 | 5/2001 | Duesman et al. | |
| 2004/0250989 A1 * | 12/2004 | Im et al. | 165/80.1 |
| 2005/0201063 A1 * | 9/2005 | Lee et al. | 361/715 |
| 2005/0276021 A1 * | 12/2005 | Gates et al. | 361/709 |
| 2006/0056154 A1 * | 3/2006 | Foster et al. | 361/700 |
| 2006/0067054 A1 * | 3/2006 | Wang et al. | 361/704 |
| 2006/0139891 A1 * | 6/2006 | Gauche et al. | 361/719 |
| 2007/0195489 A1 * | 8/2007 | Lai et al. | 361/600 |
| 2007/0263361 A1 * | 11/2007 | Lai et al. | 361/719 |

* cited by examiner ial restric-
COOLING SYSTEM FOR DEVICES HAVING POWER SEMICONDUCTORS AND METHOD FOR COOLING THE DEVICE

CROSS REFERENCE TO RELATED APPLICATION

This Utility Patent Application claims the benefit of the filing date of German Application No. DE 10 2004 009 055.6, filed Feb. 23, 2004, and International Application No. PCT/DE2005/000299, filed Feb. 22, 2005, both of which are herein incorporated by reference.

BACKGROUND

The invention provides for a cooling system for devices comprising power semiconductors and a method for cooling the type of device. In one embodiment, the invention provides for cooling on printed circuit boards which are connected to superordinate circuit carriers by means of plug-in contacts.

The evolution of heat, particularly in the case of electronic memory devices, is critical on account of the spatial restrictions, especially as the heat loss of the power semiconductors for supplying the memory devices is usually passed on via plug-in contacts to the superordinate circuit carrier, which is heated locally in the region of the connecting elements. The proportion of heat loss which can additionally be emitted directly to the surroundings via the housing of the power semiconductor is limited, with the result that there is the risk of local overheating of the power semiconductor.

Furthermore, the remaining, in particular adjacent memory semiconductor components on the same printed circuit board as the power semiconductors may be thermally loaded, resulting in the threat of memory failures. Even an active forced cooling with an impressed cooling air stream is often insufficient since the heat transfer between the housing of the power semiconductor and the cooling air stream is limited.

For these and other reasons, there is a need for the present invention.

SUMMARY

The present invention provides an inexpensive cooling system for devices having power semiconductors which enables a cost-effective thermal equalization between heat sources and the surroundings and ensures a direct cooling of the heat sources.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
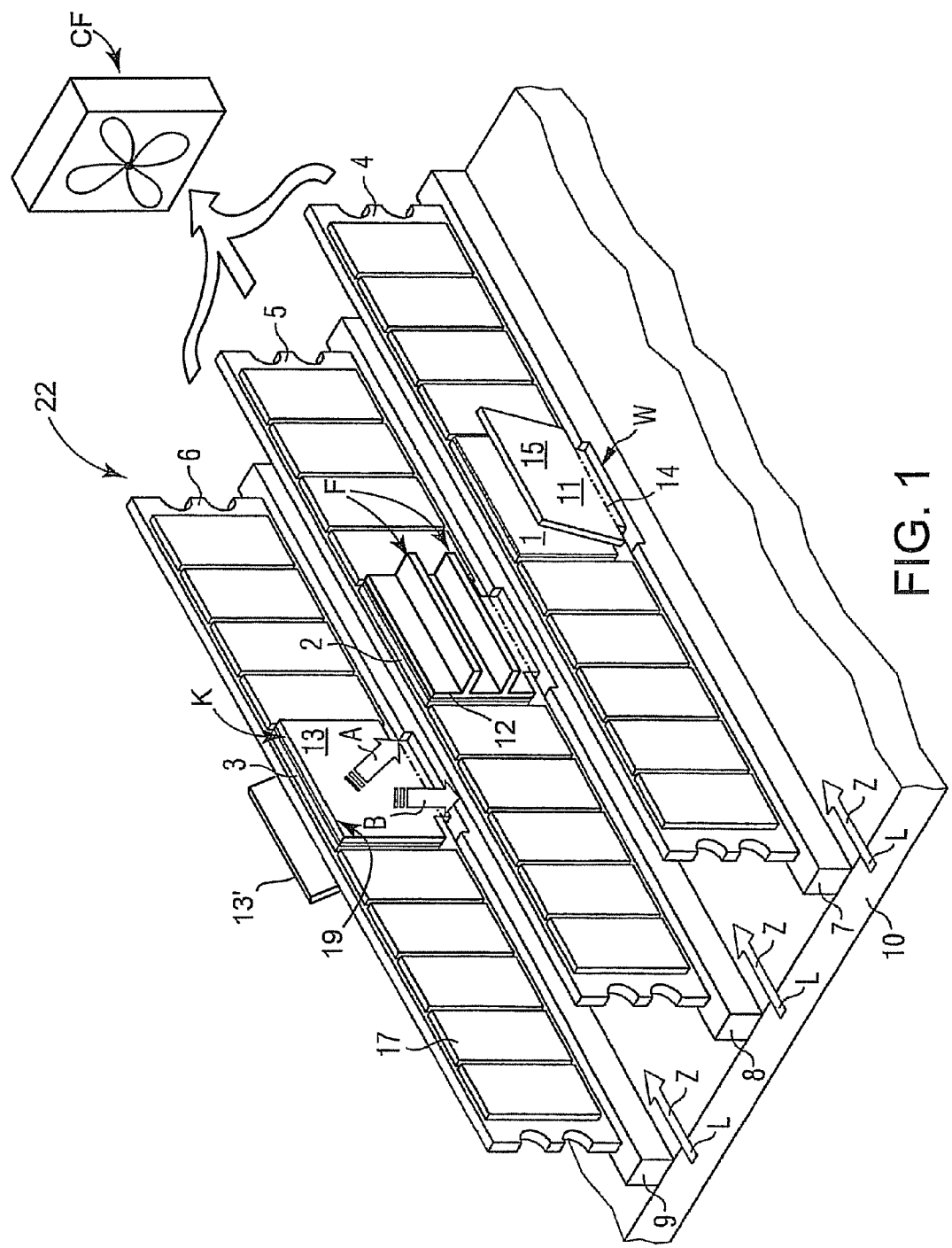
FIG. 1 illustrates a schematic, perspective view of a cooling system in accordance with a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a cooling system for devices having power semiconductor components. The power semiconductor components are arranged on printed circuit boards. The printed circuit boards, for their part, are arranged in plug-in contact strips of a superordinate circuit carrier. The cooling system has a cooling plate, which is mounted in a pivotable manner on one of the plug-in contact strips in the region of a power semiconductor component. The cooling plate can be pivoted about an axis parallel to the plug-in contact strip and has a first mounting and maintenance position pivoted away from the semiconductor component. In a second cooling and operating position, the cooling plate is pressed onto the power semiconductor component.

A cooling system of this type has the advantage that the heat distribution and the heat dissipation of the heat loss of the power semiconductor component act directly right at the heat source, namely at the power semiconductor component. The cooling plate is on the one hand a heat sink that can take up a high proportion of the heat loss of the power semiconductor component. In addition, it has a low heat transfer resistance with respect to the surroundings, so that an intensive heat radiation and hence cooling of the cooling plate can be expected.

A further advantage is that the cooling plate is not adhesively bonded directly as a heat sink on the power semiconductor component, but rather forms a pivotable or tiltable constituent part of the plug-in contact strip. The tilting mechanism is configured such that the cooling plate can assume two stable positions when it is pivoted about its tilting axis. In the first position, the mounting and maintenance position, the cooling plate clears the way to permit the introduction of a printed circuit board with its semiconductor components into the plug-in contact strip. In the second position, the cooling and operating position, the top side of the cooling plate is in contact on the power semiconductor component and forms a low heat transfer resistance from the power semiconductor component to the cooling plate. The second cooling and operating position can simultaneously be utilized to latch the printed circuit board in the plug-in contact strip. For this purpose, the cooling plate may advantageously have a snap-action closure or snap-action hook which projects beyond the edge of the printed circuit board and forms an angle of 90° with the cooling side of the cooling plate, so that the printed circuit board is locked in the plug-in contact strip of the circuit carrier.

Whereas, without a cooling plate of this type, the heat dissipation via the plug-in contact strip to the superordinate circuit carrier is restricted, this heat transfer is now improved and at the same time the emission of heat to the surroundings is intensified. While the housings of the semiconductor components are constructed from ceramic or plastic, an advantageous material for the cooling plate is copper, aluminum or alloys thereof. These metals have a high thermal conductivity and their heat emission can also be improved by blackening their surfaces, so that a cooling air stream or a forced cooling can cool the power semiconductor component more effectively.

Since the power semiconductor component of a printed circuit board develops the highest heat loss and is now cooled directly, and the cooling effort is thus directed in concentrated fashion onto the heat source, this cooling system has the further advantage that it provides for a cost-effective thermal equalization between the heat source and the surroundings. Moreover, fixing the cooling plate to the plug-in contact strip has the advantage that the power semiconductor component to be cooled does not have to be modified in terms of its external dimensions and in terms of the construction of its housing, so that the mounting costs in introducing this improved cooling system are also negligible. Moreover, expensive heat sinks fixed on the power semiconductor component can be dispensed with.

In one preferred embodiment of the invention, the cooling plate may have cooling fins on the cooling plate side not in contact with the power semiconductor component. Cooling fins of this type can intensify the cooling and they can be adapted in terms of structure and orientation to an externally impressed cooling air stream in such a way that the highest possible cooling effect is achieved. The cross-sectional form of the cooling fins can also be modified to the effect that as far as possible a low heat transfer between the cooling air stream and the cooling plate is created. Furthermore, the heat sink is enlarged by the cooling fins.

A further embodiment of the invention provides for the cooling plate to have cooling grid structures fitted on its edge sides. The cooling grid structures, on account of the pivotability of the cooling plate with regard to the plugged-in printed circuit board, can be pivoted together with the cooling plate from the semiconductor components on the printed circuit board into the first position for maintenance and mounting, so that the printed circuit board can be introduced into the plug-in contact strip without any problems. In the second position of the cooling plate, the cooling effect now extends to the semiconductor components adjacent to the power semiconductor component. A cooling grid structure of this type may comprise metallic strips or cooling fins arranged at right angles to one another. Furthermore, the final grid structure with the cooling plate can be stamped from a cooling sheet. With the cooling grid structures fitted, the heat-emitting top side of the cooling plate is enlarged and the heat distribution is distributed over the entire printed circuit board, it now also being possible for the adjacent semiconductor components to be concomitantly cooled. Moreover, slight swirls arise at the cooling grid structures, which increases the intensity of the cooling of the constrained cooling air stream.

In a further embodiment of the invention, a cooling grid structure may be arranged at the upper edge side of the cooling plate, and project beyond the printed circuit board, and project into a cooling air stream. This solution depends on the conditions of the available device interior space since the area required per printed circuit board is increased, namely by the size of the cooling grid fitted at the upper edge of the cooling plate. A cooling system embodied in this way has the advantage that a cooling air stream passed orthogonally to the orientation of the printed circuit boards through the device to be cooled must now flow through the cooling grid structure, so that the cooling effect of the cooling plate can be increased further.

Depending on how the additional cooling grid structures are arranged, a cooling air stream device that generates the cooling air stream is arranged in the device to be cooled. In this case, the forced cooling may be arranged parallel or orthogonally to the plug-in contact strips of the device to be cooled. An orthogonal arrangement is advantageous if a cooling grid structure projects beyond the printed circuit boards and projects into the cooling air stream, because the cooling is thereby intensified.

In a further embodiment of the invention, the cooling system has two cooling plates which are opposite one another and which are arranged in a pivotable manner on a plug-in contact strip in the region of the power semiconductor component. A cooling system of this type has the advantage that the cooling plate does not press against the printed circuit board on one side in the cooling and operating position, rather this pressure is neutralized by the second cooling plate on the opposite side, so that the printed circuit board itself is not mechanically loaded. Furthermore, this solution has the advantage that a printed circuit board of this type can be populated on both sides with corresponding power semiconductor components and memory components. This means that the storage density can practically be doubled without the risk of overheating of the device densely packed with semiconductor components.

A method for cooling a device having power semiconductor components has the following process. Firstly, pivotable cooling plates are mounted onto plug-in contact strips provided in the region of power semiconductor components in a first mounting and maintenance position. In this case, the plug-in contact strip may already have been arranged on a superordinate circuit carrier. Afterward, the printed circuit boards with power semiconductor components are fitted on the plug-in contact strips and the cooling plate is brought into a second cooling and operating position about an axis parallel to the plug-in contact strip. In the second position, the cooling plate bears on the power semiconductor component. In order to enable a forced cooling or active cooling, a device that generates a cooling air stream is oriented in such a way that the cooling air stream flows parallel or perpendicular to the plug-in contact strips. By means of corresponding thermal sensors it is ensured that when a critical temperature is exceeded, the cooling air stream is switched on in order to correspondingly regulate the temperature of the device.

To summarize, it can be stated that the cooling system according to the invention has the following advantages.

1. The cooling system supplies a selective and excellent thermal path from components that form an extreme amount of heat to a superordinate circuit carrier, such as a circuit board of a computer, and also by emission of heat to the surroundings, a transverse transmission of the heat to sensitive components adjacent to the components that form an extreme amount of heat being avoided.

2. This thermal solution is not fixed to the printed circuit board of a memory module, but rather is integrated into the plug-in contact strip construction of the circuit carrier without being mounted directly on the circuit carrier. Neither the circuit carrier nor the printed circuit boards need be modified for this cooling system. Only the plug-in contact strips have to be equipped with a pivoting mechanism.

3. Since the cooling plate in the form of a clip makes contact directly with the rear side of the power semiconductor components, a very good thermal path results, both in the direction of the surroundings of the module and into the superordinate circuit carrier.

4. The thermal path from the power semiconductor component into a clip-type cooling plate is furthermore more effective than previously known solutions, especially as the cooling plate as clip acts both as heat sink and as heat distributor.

FIG. 1 illustrates a schematic, perspective view of a cooling system 22 in accordance with a first embodiment of the invention. The basis of this cooling system 22 is formed by a circuit carrier 22 provided with a superordinate circuit in the manner that is customary for computer systems. Plug-in contact strips 7, 8 and 9 are oriented and arranged in a parallel fashion on the circuit carrier 10. Printed circuit boards 4, 5 and 6 plug into the plug-in contact strips 7, 8 and 9, each printed circuit board being populated with nine memory components 17 and one centrally arranged power semiconductor component 1, 2 or 3. The cooling system 22 provides as necessary for a cooling air stream L in the arrow direction indicated, which cooling air stream cools the printed circuit boards 4, 5 and 6 with their memory components 17 and power semiconductor components 1, 2 or 3.

Cooling plates 11, 12 and 13 are additionally arranged at the positions of the power semiconductor components 1, 2 and 3, and are connected to the plug-in contact strips 7, 8 and 9 in a manner such that they can be pivoted about an axis 14. The plug-in contact strip 7 has a cooling plate 11 in a first mounting and maintenance position W, in which the cooling plate 11 is pivoted away from the printed circuit board 4 about the axis 14, so that the printed circuit board 4 can be plugged into the plug-in contact strip 7 or can be withdrawn from the latter. In order to fully manifest the cooling function of the cooling plate 11, after the printed circuit board 4 has been plugged into the plug-in contact strip 7, the cooling plate 11 is brought into a second cooling and operating position K, a top side of the cooling plate 11 being pressed onto the housing of the power semiconductor component.

After this clip operation, the cooling plate 11 forms both a heat sink and a heat distribution plate for the power semiconductor component 1. The heat of a cooling plate 13 in the second position is on the one hand conducted away in arrow direction B via the plug-in contact strip to the superordinate circuit carrier 10, and on the other hand heat is emitted in arrow direction A from the cooling plate 13. In this case, the heat dissipation is intensified by the cooling air stream L in arrow direction Z.

The cooling air stream is generated by a cooling fan, such as illustrated by cooling fan CF, oriented such that the cooling air stream L flows parallel to the orientation of the printed circuit boards 4, 5 and 6. In order to increase the cooling effect of the cooling air stream L, the top side 15 of the cooling plates 11, 12 and 13 that is not in contact with the power semiconductor components 1, 2 and 3 may be equipped with cooling fins oriented parallel to the cooling air stream L, such as illustrated by cooling fins F.

This cooling system 22 on the one hand has the advantage that it is not fixed to the power semiconductor component 1, 2 or 3 itself, and on the other hand has the advantage that the cooling effect can be intensified further by cooling plates that can be tilted toward one another being provided on both sides of the printed circuit boards 4, 5 and 6, such as illustrated by cooling plate 13' being positioned opposite cooling plate 13. This further solution is associated with the advantage that the printed circuit boards 4, 5 and 6 can be populated on both sides and the storage density of this memory unit can thus be increased further without thermally overloading the device.

Figure 2:
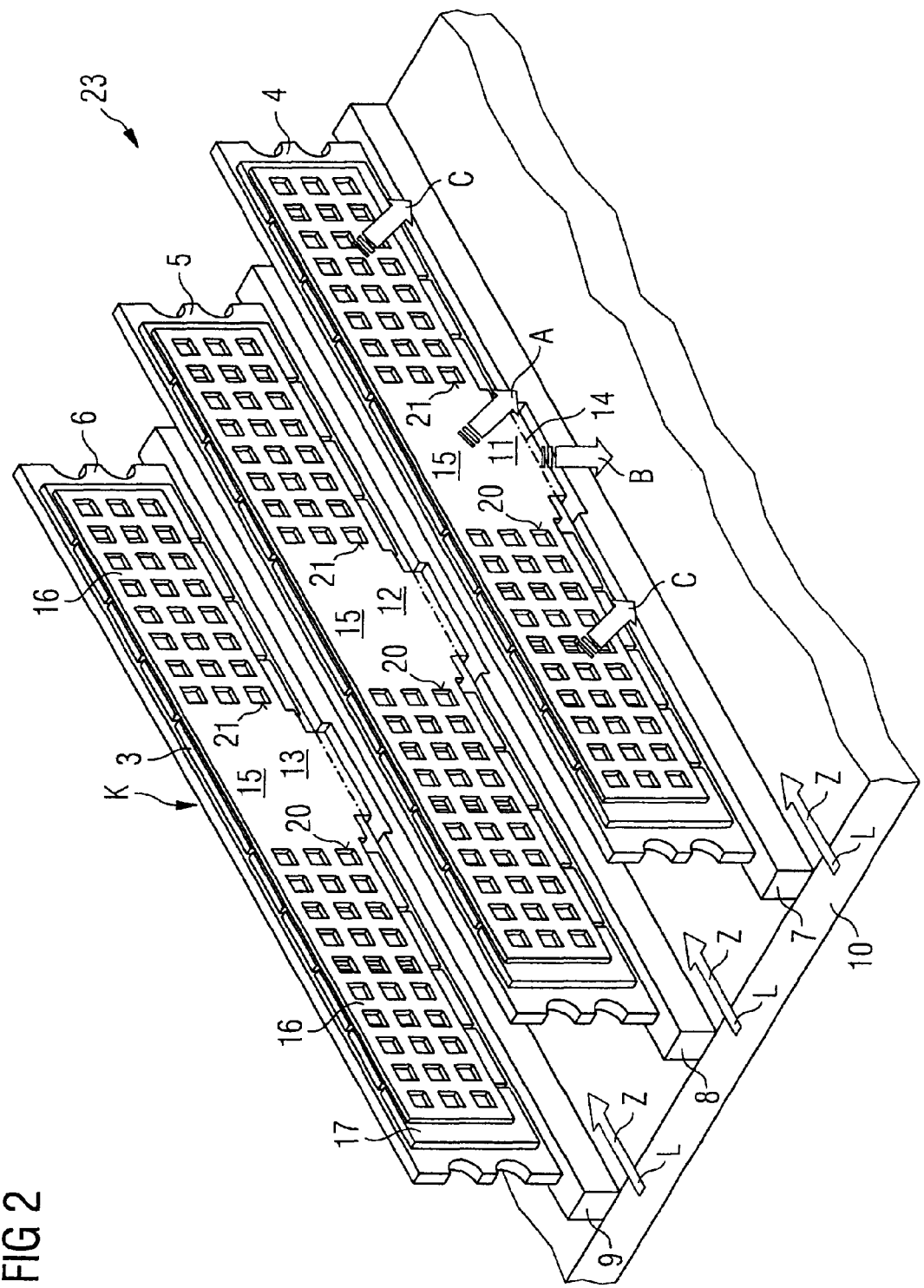
FIG. 2 illustrates a schematic, perspective view of a cooling system in accordance with a second embodiment of the invention.

FIG. 2 illustrates a schematic, perspective view of a cooling system 23 in accordance with a second embodiment of the invention. Components having the same functions as in FIG. 1 are identified by the same reference symbols and are not discussed separately.

In this second embodiment of the invention, the cooling area of the cooling plates 11, 12 and 13 is enlarged by cooling grid structures 16 fixed on the edge sides 20 and 21 of the cooling plate 12. The cooling effect of the cooling air flowing in the cooling air stream L is intensified further by the cooling grids 16, which can be pivoted together with the cooling plates 11, 12 and 13 into the mounting and maintenance position W or into the cooling and operating position K. In this case, in addition to the emission in direction A proceeding from the cooling plate 12, further emissions are made possible by the cooling grid structures 16 in arrow direction C. This variant of the cooling system according to the invention is space-saving and does not require any additional device volume, but rather can remain limited to the dimensions of the plug-in contact strips 7, 8 and 9. A further possibility (not shown here) consists in the fact that the cooling plates 11, 12 and 13 in the second cooling and operating position K fix the printed circuit boards 4, 5 and 6 in such a way that their plug-in positions in the plug-in contact strip 7, 8 or 9 remain secured. In this second embodiment of the invention, the direction Z of the forced cooling, which is also called active cooling, remains oriented in the same way as in the first embodiment of the invention as shown in FIG. 1.

Figure 3:
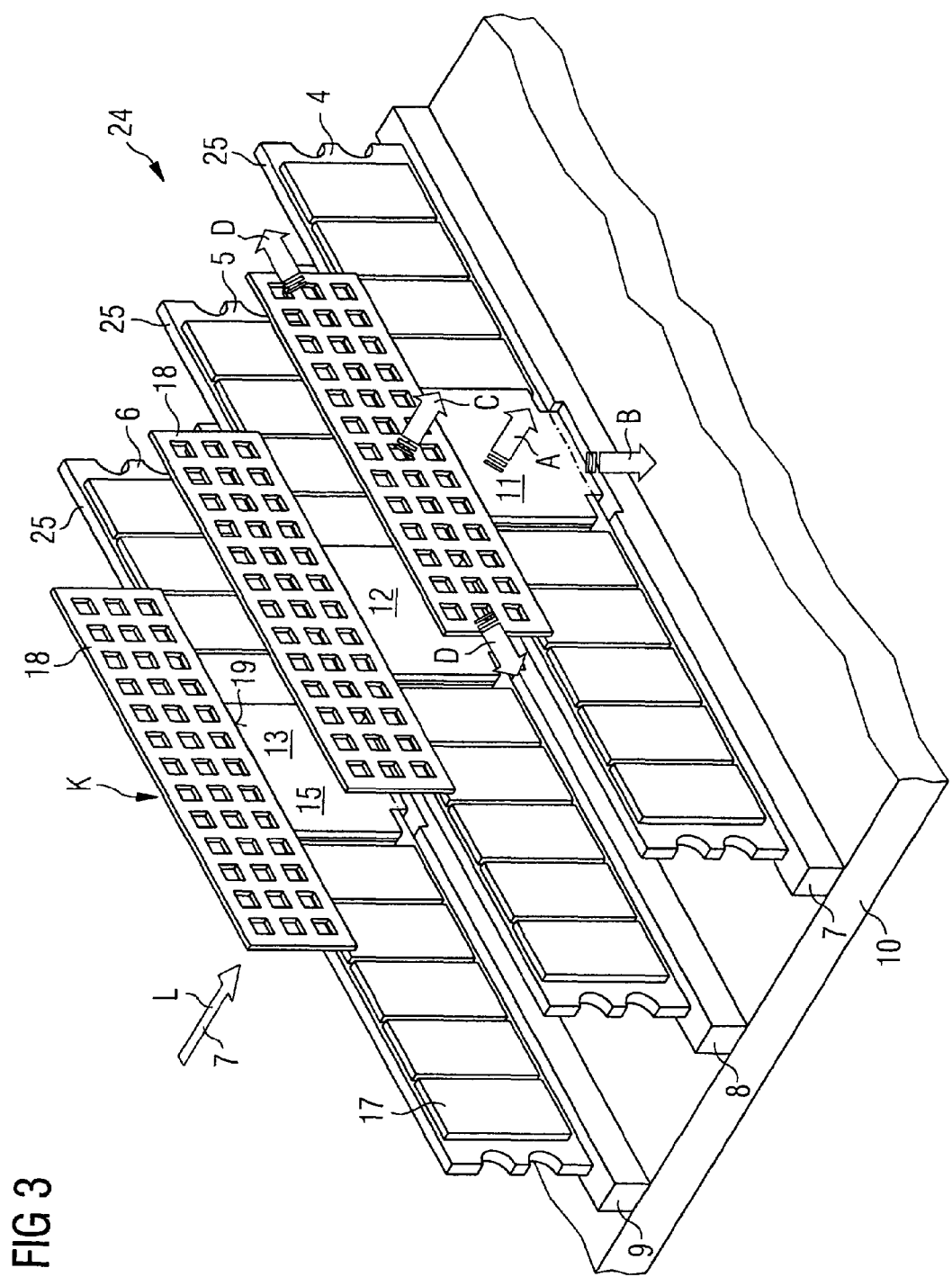
FIG. 3 illustrates a schematic, perspective view of a cooling system in accordance with a third embodiment of the invention.

FIG. 3 illustrates a schematic perspective view of a cooling system 24 in accordance with a third embodiment of the invention. Components having functions identical to those in the previous figures are identified by the same reference symbols and are not discussed separately.

The third embodiment of the invention presupposes that the memory unit to be cooled is not limited in terms of its height. The difference with respect to the previous solutions is that the cooling effect is intensified further by a cooling grid structure 18 being fixed at the upper edge side 19 of the cooling plates 11, 12 and 13, or forming an integral unit with the cooling plates 11, 12 and 13, so that the cooling grid structures 18 project beyond the upper edge 25 of the printed circuit boards 4, 5 and 6. Besides the previously possible heat emission in direction B toward the circuit carrier 10, the heat dissipation A directly from the surface of the cooling plate, and the heat emission C perpendicular to the cooling grid structure 18, in this solution there is additionally yet another possibility of heat dissipation in arrow directions D, which enable a lateral heat emission from the cooling grid structures 18. Since, furthermore, the cooling air stream L passes through the cooling grid structures 18 in direction Z of the forced cooling, this provides for an increased intensive heat dissipation in the case of this third embodiment of the invention of a cooling system 24.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A cooling system for devices comprising power semiconductor components, the power semiconductor components being arranged on printed circuit boards along with non-power type semiconductor components, the printed circuit boards arranged in plug-in contact strips of a superordinate circuit carrier, the cooling system comprising:

a cooling plate mounted in a pivotable manner, via a tilting mechanism extending from an edge of the cooling plate, to a tilting axis on a plug-in contact strip in a region of one of the power semiconductor components, and which can be pivoted about the tilting axis which extends parallel to the plug-in contact strip, and a cooling grid structure fitted on edges of the cooling plate and projecting in directions parallel to the plug-in contact strip;

the cooling plate having a first mounting and maintenance position pivoted away from the power semiconductor component, and a second cooling and operating position wherein the cooling plate is pressed directly onto and covers only the power semiconductor component while the cooling grid structure does not contact or cover the power semiconductor device. but covers only the remaining non-power semiconductor components arranged on the printed circuit board adjacent to the power semiconductor component.

2. The cooling system as claimed in claim 1, comprising wherein the cooling plate has cooling fins on the cooling plate side not in contact with the power semiconductor component.

3. The cooling system as claimed in claim 1, wherein the cooling grid structure is arranged at an upper edge side of the cooling plate and projects beyond an upper edge of the printed circuit board and into a cooling air stream.

4. The cooling system as claimed in claim 1, comprising wherein a cooling air stream device that generates a cooling air stream is arranged in such a way that it has a forced cooling parallel to the plug-in contact strips of the device to be cooled.

5. The cooling system as claimed in claim 1, wherein a cooling air stream device generates a cooling air stream which is perpendicular to the plug-in contact strips and into which the cooling grid structure projects.

6. The cooling system as claimed in claim 1, wherein the cooling system has a second cooling plate, wherein the cooling plate and the second cooling plate are positioned opposite one another and which are arranged in a pivotable manner on the plug-in contact strip in the region of a power semiconductor components on opposite sides of a corresponding printed circuit board.

7. The cooling system of claim 1, wherein the cooling grid structure comprises metallic strips or cooling fins arranged at right angles to one another.

8. The cooling system of claim 1, wherein the tilting mechanism extends from the edge of the cooling plate and at an angle to a surface of the cooling plate which is pressed onto the power semiconductor component when the cooling plate is in the operating position.

9. The cooling system of claim 8, wherein the angle comprises a 90-degree angle.

10. The cooling system of claim 8, wherein the tilting mechanism comprises a snap action closure which snaps about the tilting axis.

11. The cooling system of claim 8, wherein the tilting mechanism comprises a snap-action hook which snaps about the tilting axis.

12. A power semiconductor device comprising:

at least one printed circuit board arranged in one of a plurality of plug-in contact strips of a superordinate circuit carrier and having at least one power semiconductor component positioned thereon and a plurality of other semiconductor components arranged adjacent thereto;

a cooling plate mounted in a pivotable manner, via a tilting mechanism extending from an edge of the cooling plate, to a tilting axis on the plug-in contact strip in a region of the at least one of power semiconductor component and configured to be pivoted about the tilting axis via the tilting mechanism, wherein the tilting axis extends parallel to the plug-in contact strip; and a cooling grid structure fitted on and extending from edges of the cooling plate, the cooling plate having a first mounting and maintenance position pivoted away from the power semiconductor component, and a second cooling and operating position wherein the cooling plate is pressed directly onto and covers only the power semiconductor component while the cooling grid structure does not contact or cover the power semiconductor component but covers at least a portion of only the plurality of other semiconductor components.

13. The device as claimed in claim 12, comprising wherein the cooling plate has cooling fins on the cooling plate side not in contact with the power semiconductor component.

14. The device as claimed in claim 12, comprising wherein the cooling grid structure is configured at an upper edge side of the cooling plate and projects beyond an upper edge of the printed circuit board and into a cooling air stream.

15. The device as claimed in claim 12, comprising wherein a cooling air stream device that generates a cooling air stream is arranged in such a way that it has a forced cooling parallel to the plug-in contact strips of the device to be cooled.

16. The device as claimed in claim 12, comprising wherein a cooling air stream device generates a cooling air stream which is perpendicular to the plug-in contact strips and into which the cooling grid structure projects.

17. The device as claimed in claim 12, wherein a second cooling plate is mounted in a pivotable manner on the plug-in contact strip in the region of a power semiconductor component opposite to the cooling plate and on an other side of the printed circuit board.

18. The power semiconductor device of claim 12, wherein the other semiconductor components comprise semiconductor memory components.

19. The power semiconductor device of claim 12, wherein the cooling grid structure comprises metallic strips or cooling fins arranged at right angles to one another.

20. A method for cooling a device having power semiconductor components, the method comprising:

mounting pivotable cooling plates via tilting mechanisms extending from edges of the cooling plates to tilting axes extending along plug-in contact strips of a superordinate circuit carrier, the cooling plates being in a mounting and maintenance position and having a cooling grid structure fitted on and extending from edges thereof;

fitting printed circuit boards into the plug-in contact strips, the printed circuit boards having at least one power semiconductor component positioned thereon and a plurality of other semiconductor components arranged adjacent thereto, wherein the cooling plates are positioned along the plug-in contact strip in regions of the power semiconductor components;

pivoting the cooling plates about the tilting axes from the mounting and maintenance position into a cooling or operating position wherein the cooling plates are held directly in contact with a corresponding power semiconductor component of a corresponding printed circuit board while the cooling grid structure does not contact or cover the power semiconductor component but covers only the plurality of other semiconductor components adjacent thereto;

orienting a device generating a cooling air stream, such that the cooling air stream flows parallel or perpendicular to the plug-in contact strips; and providing the cooling air stream during operation of the power semiconductor components in the event of a critical temperature of the power semiconductor components being reached.

21. A cooling system for devices comprising at least one power semiconductor component, the power semiconductor component being arranged, along with a plurality of other semiconductor components, on a printed circuit board arranged in a plug-in contact strip of a superordinate circuit carrier, the cooling system comprising:

a cooling plate mounted in a pivotable manner, via a tilting mechanism extending from an edge of the cooling plate, to a tilting axis extending along the plug-in contact strip in a region of the at least one power semiconductor component, the cooling plate having a cooling grid structure fitted on and extending from edges thereof;

means for pivoting the cooling plate about the tilting axis, which is parallel to the plug-in contact strip, between a first-mounting and maintenance position wherein the cooling plate is away from the power semiconductor component, and a second cooling and operating position wherein the cooling plate is pressed directly onto the power semiconductor component while the cooling grid structure is positioned so as to not contact or cover the power semiconductor component.

22. The cooling system as claimed in claim 21, wherein the cooling plate has cooling fins on the cooling plate side not in contact with the power semiconductor component.

23. The cooling system of claim 22, wherein the tilting mechanism extends from the edge of the cooling plate and at an angle to a surface of the cooling plate which is pressed onto the power semiconductor component when the cooling plate is in the operating position.

24. The cooling system of claim 21, wherein the cooling grid structure comprises metallic strips or cooling fins arranged at right angles to one another.

25. The cooling system of claim 21, wherein the means for pivoting comprises a snap-action tilting mechanism extending from an edge of the cooling plate which snaps onto and is rotatable about the tilting axis.

* * * * *